(12) United States Patent
Shih et al.

(10) Patent No.: US 11,621,217 B2
(45) Date of Patent: Apr. 4, 2023

(54) SUBSTRATE STRUCTURE AND SEMICONDUCTOR PACKAGE STRUCTURE

(71) Applicant: Advanced Semiconductor Engineering, Inc., Kaohsiung (TW)

(72) Inventors: Chun-Wei Shih, Kaohsiung (TW); Sheng-Wen Yang, Kaohsiung (TW); Chung-Hung Lai, Kaohsiung (TW); Chin-Li Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 141 days.

(21) Appl. No.: 17/151,062

(22) Filed: Jan. 15, 2021

(65) Prior Publication Data

US 2022/0230946 A1   Jul. 21, 2022

(51) Int. Cl.
*H01L 23/48* (2006.01)
*H01L 23/498* (2006.01)
*H01L 23/31* (2006.01)
*H01L 23/538* (2006.01)

(52) U.S. Cl.
CPC .... *H01L 23/49816* (2013.01); *H01L 23/3192* (2013.01); *H01L 23/49822* (2013.01); *H01L 23/5383* (2013.01)

(58) Field of Classification Search
CPC .......... H01L 23/49816; H01L 23/3192; H01L 23/49822; H01L 23/5383
See application file for complete search history.

(56) References Cited

U.S. PATENT DOCUMENTS

| | | | | |
|---|---|---|---|---|
| 10,784,223 | B2* | 9/2020 | Chuang | H01L 24/81 |
| 2009/0160052 | A1* | 6/2009 | Yang | H01L 24/05 |
| | | | | 257/738 |
| 2013/0009293 | A1* | 1/2013 | Tseng | H01L 23/49827 |
| | | | | 257/E23.033 |
| 2014/0353827 | A1* | 12/2014 | Liu | H01L 24/09 |
| | | | | 257/774 |
| 2016/0118311 | A1* | 4/2016 | Hu | H01L 21/6835 |
| | | | | 257/737 |
| 2016/0141262 | A1* | 5/2016 | Hu | H01L 21/6835 |
| | | | | 257/738 |
| 2017/0005000 | A1* | 1/2017 | Beyne | H01L 21/76844 |
| 2019/0139921 | A1* | 5/2019 | Baek | H01L 24/13 |
| 2019/0259789 | A1* | 8/2019 | Chen | H01L 27/1463 |
| 2020/0411441 | A1* | 12/2020 | Darmawikarta | H01L 23/5381 |
| 2021/0035908 | A1* | 2/2021 | Lee | H01L 24/17 |
| 2021/0134742 | A1* | 5/2021 | Chockalingam | H01L 24/03 |

(Continued)

*Primary Examiner* — Nicholas J Tobergte
(74) *Attorney, Agent, or Firm* — Foley & Lardner LLP

(57) ABSTRACT

A substrate structure and a semiconductor package structure are provided. The substrate structure includes a first dielectric layer, a pad and a conductive structure. The first dielectric layer has a first surface and a second surface opposite to the first surface. The pad is adjacent to the first surface and at least partially embedded in the first dielectric layer. The first dielectric layer has an opening exposing the pad, and a width of the opening is less than a width of the pad. The conductive structure is disposed on the pad and composed of a first portion outside the opening of the first dielectric layer and a second portion embedded in the opening of the first dielectric layer. The first portion has an aspect ratio exceeding 1.375.

17 Claims, 16 Drawing Sheets

(56) References Cited

U.S. PATENT DOCUMENTS

| | | | | |
|---|---|---|---|---|
| 2021/0193577 A1* | 6/2021 | Lin | ...................... | H01L 23/3128 |
| 2021/0327819 A1* | 10/2021 | Fang | ...................... | H01L 27/148 |
| 2021/0407942 A1* | 12/2021 | Yu | .......................... | H01L 24/19 |
| 2022/0208649 A1* | 6/2022 | Oh | ...................... | H01L 23/5386 |

* cited by examiner

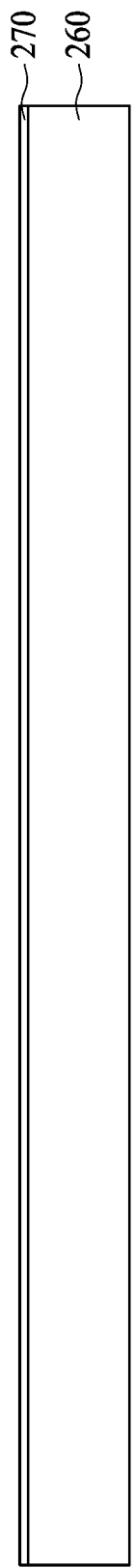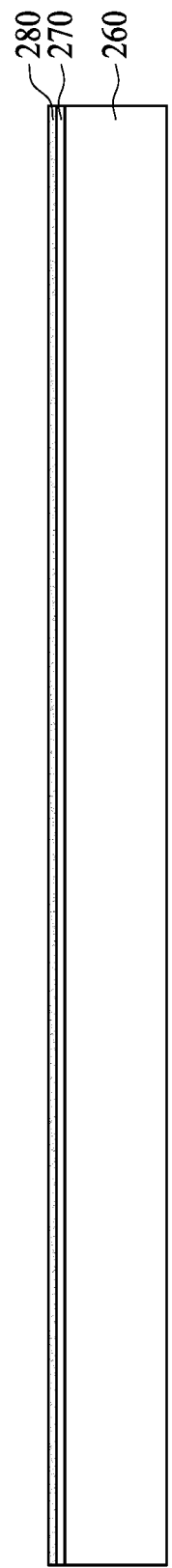

SUBSTRATE STRUCTURE AND SEMICONDUCTOR PACKAGE STRUCTURE

BACKGROUND

1. Field of the Disclosure

The present disclosure relates to a semiconductor package structure and method for manufacturing the same, and to a semiconductor package structure including a clipped dielectric layer.

2. Description of the Related Art

In order to increase the number of input/output (I/O) terminals, the diameters of tall pillars have been reduced. However, as the diameter is reduced, bonding strength between the tall pillar and the dielectric becomes commensurately weaker, which can lead to the pillars collapsing during photoresist striping. Thus, a new semiconductor package structure ameliorating such deficiency is required.

SUMMARY

In some embodiments, a substrate structure includes a first dielectric layer, a pad and a conductive structure. The first dielectric layer has a first surface and a second surface opposite to the first surface. The pad is adjacent to the first surface and at least partially embedded in the first dielectric layer. The first dielectric layer has an opening exposing the pad, and a width of the opening is less than a width of the pad. The conductive structure is disposed on the pad and composed of a first portion outside the opening of the first dielectric layer and a second portion embedded in the opening of the first dielectric layer. The first portion has an aspect ratio exceeding 1.375.

In some embodiments, a semiconductor package structure includes a first dielectric, a pad, a conductive structure, a first redistribution structure and an electronic component. The first dielectric layer has a first surface and a second surface opposite to the first surface. The pad is adjacent to the first surface and at least partially embedded in the first dielectric layer. The first dielectric layer has an opening exposing the pad, and a width of the opening is less than a width of the pad. The conductive structure is disposed on the pad and partially in the opening of the first dielectric layer. The first redistribution structure is disposed on the conductive structure. The electronic component is disposed on the second surface of the first dielectric layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIGS. 8A, 8B, 8C, 8D, 8E, 8F, 8G, 8H, 8I, 8J, 8K, 8L and 8M respectively illustrate one or more stages of an example of a method for manufacturing a semiconductor package structure according to some embodiments of the present disclosure.

DETAILED DESCRIPTION

Figure 1:
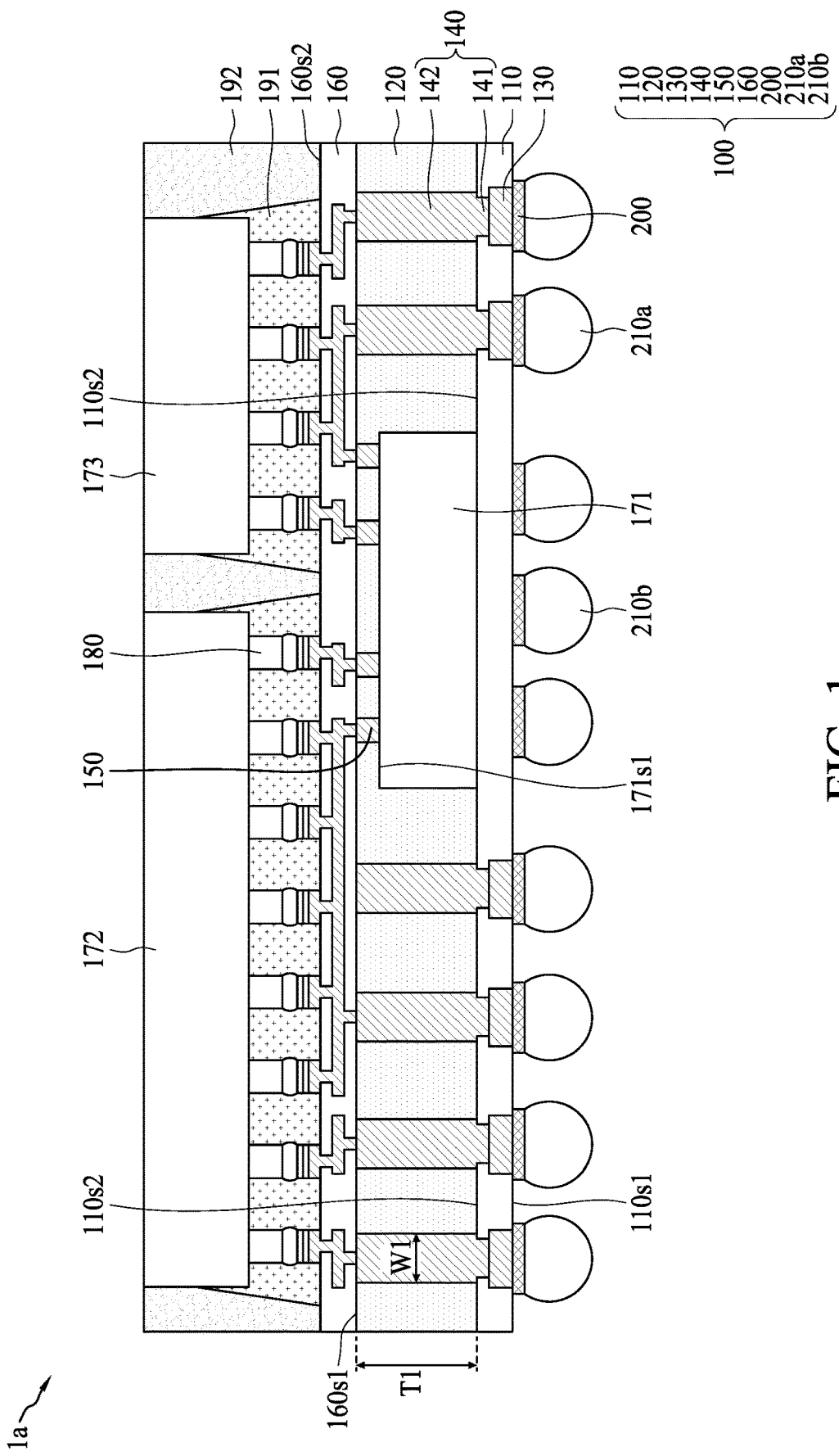
FIG. 1 is a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a semiconductor package, conductive pillars such as tall pillars are used to electrically interconnect two electronic components. Conductive pillars may penetrate a dielectric layer and an encapsulant and can vertically connect a redistribution structure and bumps electrically. In order to form the conductive pillars, a patterned photoresist layer may be formed on the dielectric layer to define a plurality of openings exposing the dielectric layer, and an etching technique performed to remove a portion of the dielectric layer exposed by the openings of the patterned photoresist layer. Next, a conductive material may be filled into the openings defined by the dielectric layer and the patterned photoresist layer to form the conductive pillars. In a conventional semiconductor package structure, the conductive pillar may have an aspect ratio of about 1.375 or less. For example, the conductive pillar may have a height of about 210 μm and a width (or diameter) of about 160 μm. In this condition, bonding strength between the conductive pillar and the dielectric layer is sufficient to prevent the conductive pillars from collapse during patterned photoresist layer striping. However, in order to increase the number of I/Os, the conductive pillar with a greater aspect ratio, such as exceeding 1.375, is required. For example, the conductive pillar may have a height of 110 µm and a width (or diameter) of 70 µm, and may have an aspect ratio of about 1.6. The relatively high aspect ratio correspondingly increases bonding strength between the conductive pillar and the patterned photoresist layer compared to that between the conductive pillar and the dielectric layer due to the change in contact area therebetween. As a result, the conductive pillars may be prone to collapse during patterned photoresist layer striping. In this disclosure, a new semiconductor package structure with a clipped dielectric structure is provided to improve the aforementioned problems, especially to the semiconductor package structure including a conductive structure with aspect ratio greater than 1.375.

FIG. 1 is a cross-sectional view of an example of a semiconductor package structure 1a according to some embodiments of the present disclosure. The semiconductor package structure 1a may include a substrate structure 100, a bridge circuit 171, a semiconductor die 172, another semiconductor die 173, a plurality of connecting elements 180, an underfill 191, and an encapsulant 192.

The substrate structure 100 may include a dielectric layer 110, an encapsulant 120, a pad 130, a plurality of conductive structures 140, a plurality of terminals 150, a redistribution structure 160, a plurality of connection elements 200, and a plurality of bumps 210a and 210b. The substrate structure 100 may, but is not limited thereto, electrically connect different electronic components, and can be applicable to different package structures, such as a SFoCOS (Fan-Out Chip on Substrate) structure, a FoPOP (Fan-Out Package on Package) structure or other suitable package structures.

The dielectric layer 110 may include a surface 110s1 and a surface 110s2. The surface 110s1 is opposite to the surface 110s2. The surface 110s1 may also be referred to as a lower surface of the dielectric layer 110. The surface 110s2 may also be referred to as an upper surface of the dielectric layer 110. The dielectric layer 110 may be configured to, for example, protect conductive elements, such as the pads 130, from damage. In some embodiments, the dielectric layer 110 may include a polyimide (PI), a benzocyclobutene (BCB) based polymer or other suitable materials. In some embodiments, the thickness of the dielectric layer 110 may range from about 7 µm to about 9 µm, such as 7 µm, 7.3 µm, 7.6 µm, 7.9 µm, 8.2 µm, 8.5 µm or 8.8 µm. The dielectric layer 110 may define or have an opening exposing the pad 130. The opening may be recessed from the surface 110s2 of the dielectric layer 110.

The encapsulant 120 may be disposed on the surface 110s2 of the dielectric layer 110. The encapsulant 120 may cover the dielectric layer 110. The encapsulant 120 may cover the bridge circuit 171, the conductive structure 140 and the terminal 150. In some embodiments, the encapsulant 120 may encapsulant a portion of the conductive structure 140. A top surface of the encapsulant 120 may be coplanar with a top surface of the conductive structure 140 and a top surface of the terminal 150. The encapsulant 120 may include insulation or a dielectric material. In some embodiments, the material of the encapsulant 120 may differ from that of the dielectric layer 110. In some embodiments, the encapsulant 120 is molding material that may include, for example, a Novolac-based resin, an epoxy-based resin, a silicone-based resin, or other another suitable encapsulant. Suitable fillers may also be included, such as powdered $SiO_2$.

The pad 130 may be adjacent to the surface 110s1 and at least partially embedded in the dielectric layer 110. In some embodiments, the pad 130 may include, for example, copper, another conductive metal, or an alloy thereof. In some embodiments, the lower surface of the pad 130 is substantially coplanar with the surface 110s1 of the dielectric layer 110. That is, the lower surface of the pad 130 may be exposed from the dielectric layer 110. In some embodiments, a ratio between a thickness of the pad 130 and a thickness of the dielectric layer 110 may range from about 0.33 to about 0.78. In some embodiments, a ratio between a thickness of the pad 130 and a thickness of the dielectric layer 110 may range from about 0.42 to about 0.78, such as 0.56 or 0.67. In some embodiments, the thickness of the pad 130 is greater than about 3 µm. In some embodiments, the thickness of the pad 130 may range from about 3 µm to about 7 µm, such as 4 µm, 5 µm or 6 µm. The width (or diameter or aperture) of the opening of the dielectric layer 110 may be less than the width (or diameter) of the pad 130. In some embodiments, the dielectric layer 110 may cover the sidewall of the pad 130 and the upper surface of the pad 130.

The conductive structures 140 may be disposed on the pad 130. The conductive structure 140 may include, for example, pillars or tall pillars with an aspect ratio greater than 1.1. The conductive structure 140 may be in contact with the pad 130. The conductive structure 140 may electrically connect, for example, the bumps 210a and the semiconductor die 172 and/or the semiconductor die 173 through the redistribution structure 160. The conductive structure 140 may include, for example, copper, another conductive metal, or an alloy thereof. It is contemplated that there may be a seed layer (not shown) disposed between the conductive structure 140 and the pad 130. The conductive structure 140 may be at least partially embedded in the dielectric layer 110. The conductive structure has a first material and the pad 130 has a second material. In some embodiments, the first material is the same as the second material, which is assisting in improving the bonding strength between the conductive structures 140 and the pad 130 due to the same lattice between them. In some embodiments, the material of the conductive structures 140 is the same as the material of the pad 130. By way of example, the first material and the second material include copper or other suitable conductive material.

The conductive structure 140 may include a portion 141 and a portion 142 connected to the portion 141. The conductive structure 140 may be composed of a portion 142 outside the opening of the dielectric layer 110 and a portion 141 embedded in (or disposed within) the opening of the dielectric layer 110. The portion 141 and/or the portion 142 may have a circular profile or other suitable top-viewed profile. A width (or diameter) of the portion 142 may exceed a width (or diameter) of the portion 141. In some embodiments, the width (or diameter) of the pad 130 may be greater than that of the conductive structure 140. In some embodiments, the width (or diameter) of the portion 142 may be less than that of the pad 130, which may assist in improving the bonding strength between the conductive structure 140 and the dielectric layer 110. In some embodiments, the width (or diameter) of the portion 141 may be less than that of the pad 130, which may assist in improving the bonding strength between the conductive structure 140 and the dielectric layer 110. The portion 142 may also be referred to as a main portion of the conductive structure 140. The portion 141 of the conductive structure 140 may penetrate or extend through the dielectric layer 110 to contact or electrically connect the pad 130. The portion 141 may be disposed on the pad 130. In some embodiments, a pitch of the conductive structure 140 is less than 150 µm.

The portion 142 may be disposed on the portion 141. The portion 142 is outside the opening of the dielectric layer 110.

The portion 142 of the conductive structure 140 may extend through or penetrate the encapsulant 120 to contact or electrically connect the redistribution structure 160. The portion 142 may have a height T1 and a width (or diameter) W1. In some embodiments, the height T1 of the portion 142 of the conductive structure 140 is greater than about 110 μm. In some embodiments, the height T1 of the portion 142 of the conductive structure 140 may range from about 110 μm to about 220 μm, such as 120 μm, 130 μm, 140 μm, 150 μm, 160 μm, 170 μm, 180 μm, 190 μm, 200 μm or 210 μm. In some embodiments, the width W1 (or diameter) of the portion 142 may less than about 70 such as 68 μm, 65 μm, 62 μm, 60 μm, 58 μm, 52 μm, 50 μm, 48 μm, 45 μm, 42 μm or 40 μm. In other embodiments, the width W1 (or diameter) of the portion 142 may range from about 70 μm to about 160 μm, such as 80 μm, 90 μm, 100 μm, 110 μm, 120 μm, 130 μm, 140 μm or 150 μm. In some embodiments, the aspect ratio of the portion 142 may exceed about 1.375 (e.g., the height T1 of the portion 142 of the conductive structure 140 is greater than about 110 μm, such as 210 μm, and the width W1 (or diameter) of the portion 142 is less than 160 μm, such as 150 μm). In some embodiments, the aspect ratio of the portion 142 may range between 1.375 and about 1.6 (e.g., the height T1 of the portion 142 of the conductive structure 140 is greater than about 110 μm, such as 120 μm, and the width W1 (or diameter) of the portion 142 is less than 160 μm, such as 80 μm). In some embodiments, the aspect ratio of the portion 142 may be equal to or greater than about 1.6 (e.g., the height T1 of the portion 142 of the conductive structure 140 is greater than about 110 μm, such as 120 μm, and the width W1 (or diameter) of the portion 142 is less than 70 μm, such as 68 μm).

In some embodiments, the conductive structure 140 and the pad 130 may collectively clip the dielectric layer 110. That is, a portion of the dielectric layer 110 may be disposed between the conductive structure 140 and the pad 130 and partially surrounded by the conductive structure 140 and the pad 130. As shown in FIG. 1, the pad 130, the portion 141 and the portion 142 may form a clip clipping the dielectric layer 110.

The bridge circuit 171 (or an electronic component) may be disposed on the dielectric layer 110. The bridge circuit 171 may be coupled to the semiconductor die 172 (or an electronic component) and the semiconductor die 173 (or an electronic component) through the redistribution structure 160. The bridge circuit 171 may be configured to electrically connect the semiconductor die 172 and the semiconductor die 173. In some embodiments, the bridge circuit 171 may be disposed on the surface 110s2 of the dielectric layer 110. In some embodiments, the bridge circuit 171 may be a bridge die. In some embodiments, the bridge circuit 171 may include a high-level data link control (HDLC) chip. As shown in FIG. 1, the bridge circuit 171 may have a surface 171s1 (e.g., an active surface) facing away from the dielectric layer 110. The bridge circuit 171 may be attached to the dielectric layer 110 through an adhesive layer (not shown).

The terminals 150 may be disposed on the surface 171s1 (e.g., the active surface) of the bridge circuit 171 and embedded in the encapsulant 120. The terminals 150 may contact or electrically connect the redistribution structure 160. The terminals 150 may be electrically connected to the semiconductor die 172 and the semiconductor die 173 through the redistribution structure 160. The terminal 150 may include, for example, copper, another conductive metal, or an alloy thereof.

The redistribution structure 160 may be disposed on the encapsulant 120. The redistribution structure 160 may include a plurality of dielectric layers, at least one circuit layer and a plurality of vias embedded in the dielectric layers. The redistribution structure 160 may be used to electrically connect, for example, the semiconductor die 172, the semiconductor die 173, and the bridge circuit 171. The redistribution structure 160 may have a surface 160s1 and a surface 160s2 opposite to the surface 160s1. The surface 160s1 may face the bridge circuit 171.

The semiconductor die 172 and/or the semiconductor die 173 may be disposed on and electrically connected to the redistribution structure 160 through connecting elements 180 (e.g., solder bumps or other conductive bumps). The semiconductor die 172 and/or the semiconductor die 173 may be disposed above the bridge circuit 171. The semiconductor die 172 may be, for example, an application specific integrated circuit (ASIC). The semiconductor die 173 may be, for example, a high bandwidth memory (HBM). The semiconductor die 172 may be electrically connected to the semiconductor die 173 through the bridge circuit 171. The active surface of the semiconductor die 172 or the semiconductor die 173 may face the active surface (e.g., surface 171s1) of the bridge circuit 171.

The underfill 191 may be disposed in a space between the semiconductor die 172 and the surface 160s2 of the redistribution structure 160, and in a space between the semiconductor die 173 and the surface 160s2 of the redistribution structure 160. The underfill 191 may be configured to, for example, protect the connecting elements 180.

The encapsulant 192 may be disposed on the underfill 191. The encapsulant 192 may surround the semiconductor die 172 and/or the semiconductor die 173. In some embodiments, the upper surface of the semiconductor die 172 and/or the semiconductor die 173 may be substantially coplanar with the upper surface of the encapsulant 192.

The connection elements 200 may be disposed on the surface 110s1 of the dielectric layer 110. Each of the connection elements 200 may be in contact with a corresponding pad 130. In some embodiments, a width (or diameter) of the connection element 200 may exceed the width (or diameter) of the pad 130.

The bumps 210a may be disposed on the surface 110s1 of the dielectric layer 110. The bumps 210a may be disposed on the connection elements 200. The bump 210a may include, for example, a solder bump or a solder ball. The bumps 210a may be disposed adjacent to the surface 110s1 of the dielectric layer 110 for external connection. In some embodiments, the bump 210a may vertically overlap the conductive structure 140. In some embodiments, the bump 210a may be free from vertically overlapping the bridge circuit 171.

The bumps 210b may be disposed on the surface 110s1 of the dielectric layer 110. The bumps 210b may be disposed on the connection elements 200. The bumps 210b may be surrounded by the bumps 210a. In some embodiments, the bump 210b may vertically overlap the bridge circuit 171. In some embodiments, the bump 210b may be vertically free from overlapping the conductive structure 140. The bump 210b may be electrically isolated from the conductive structure 140. The bump 210b may be configured to serve as a dummy solder, which can enhance the stability of the overall structure.

Figure 2A:
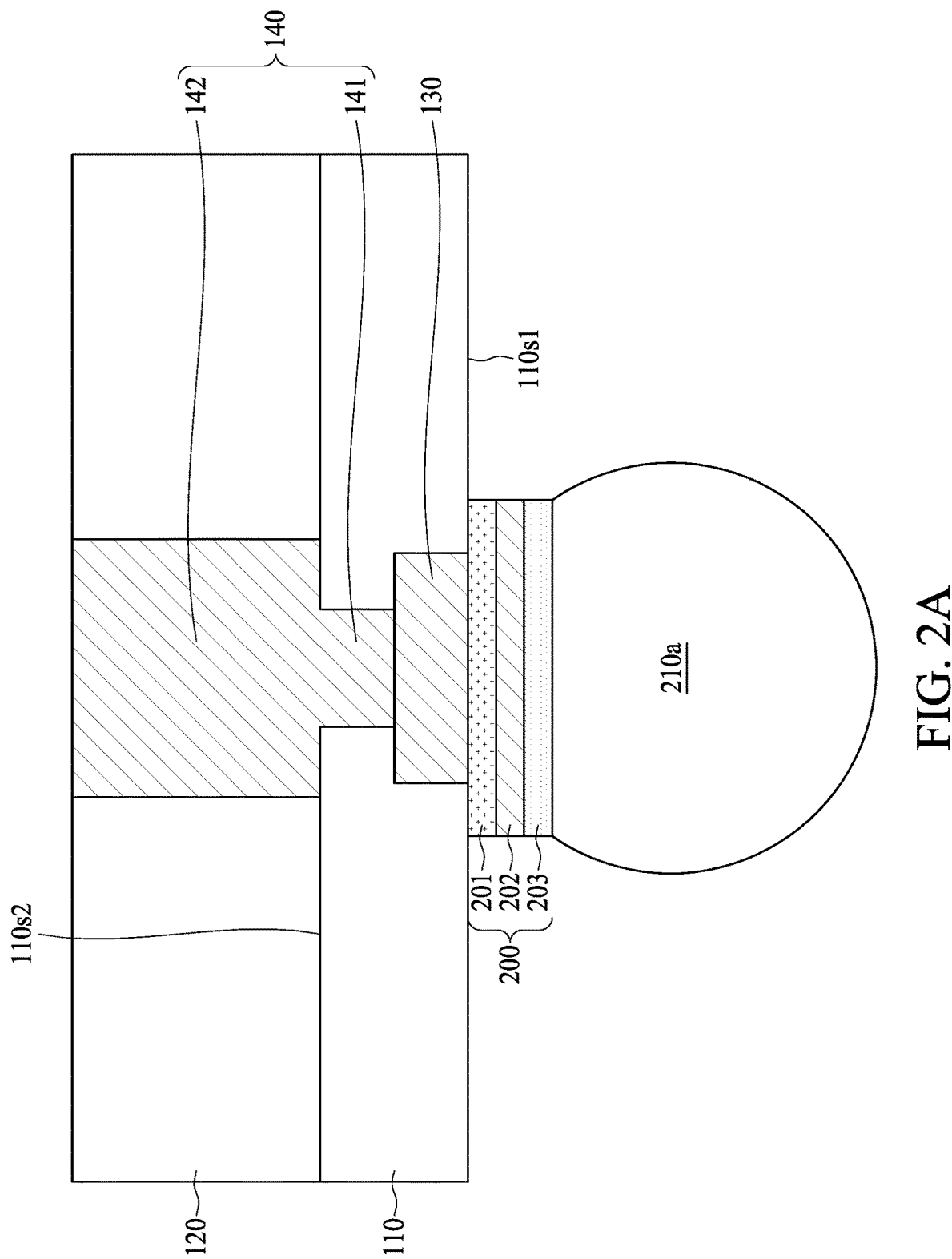
FIG. 2A is a partial enlarged view of FIG. 1.

FIG. 2A is a partial enlarged view of FIG. 1, showing that the connection element 200 may be disposed on the surface 110s1 of the dielectric layer 110. The connection element 200 may include a layer 201, a layer 202, and a layer 203. The layer 202 may be disposed on layer 201 and spaced apart from the pad 130. The layer 203 may be disposed on the layer 202. The materials of layer 201, the layer 202, and the layer 203 may be different from each other. For example, layer 201 may include a titanium layer. The layer 202 may include a copper layer. The layer 203 may include a AgSn layer. The bump 210a may be in contact with the layer 203 of the connection element 200.

Figure 2B:
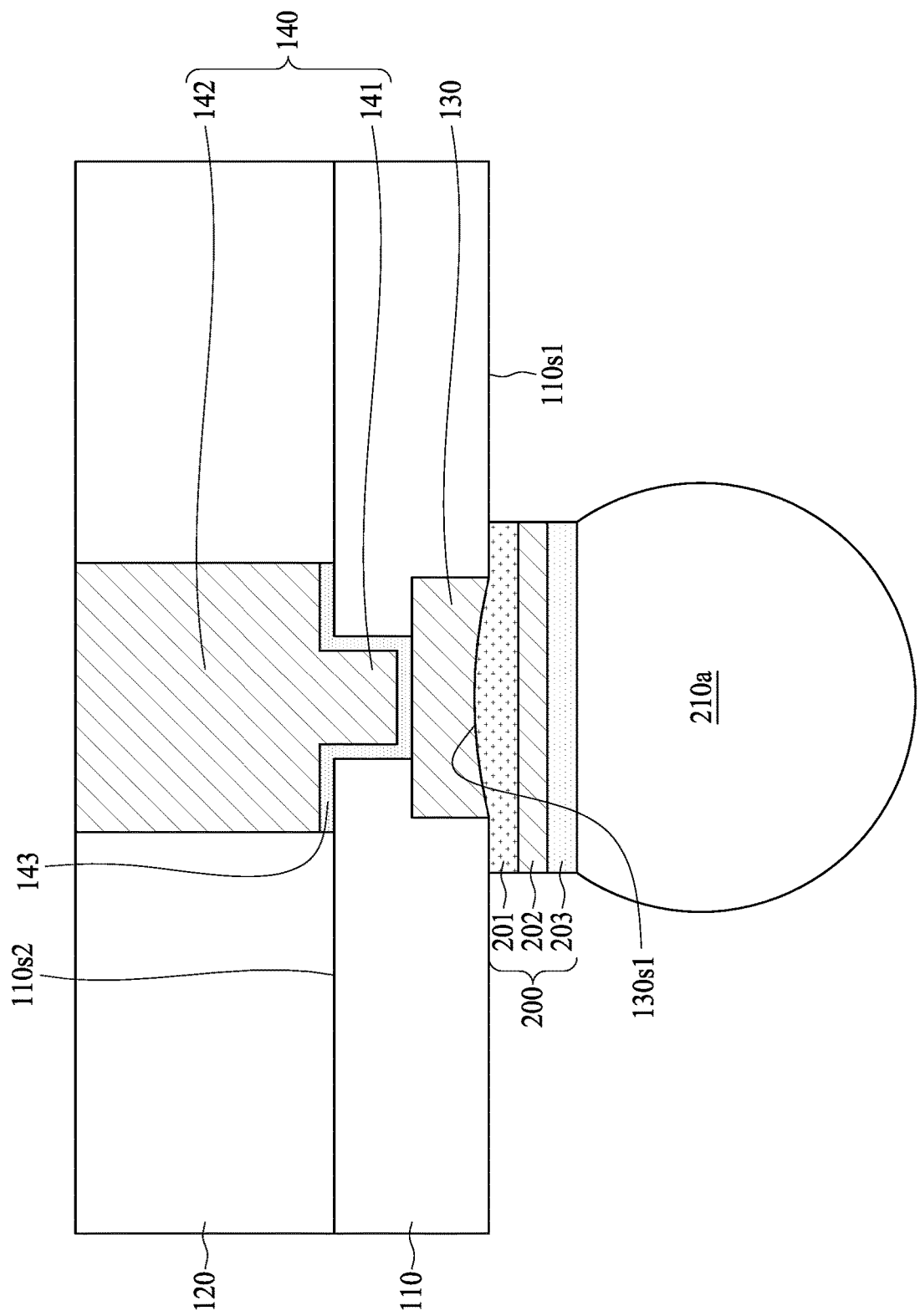
FIG. 2B is a partial enlarged view of FIG. 1.

FIG. 2B is a cross-sectional view of an example of a semiconductor package structure 1a according to some embodiments of the present disclosure. In some embodiments, the pad 130 may have a surface 130s1 concaved from the surface 110s1 of the dielectric layer 110. The surface 130s1 may be far from the conductive structure 140. The layer 201 may have a convex surface. As shown in FIG. 2B, the semiconductor device structure 1a (or the conductive structure 140) may further include a seed layer 143. The seed layer 143 may include, for example, titanium or other suitable materials. In some embodiments, the seed layer 143 may be the outermost layer of the portion 141. In some embodiments, the seed layer 143 may be disposed between the portion 142 and the pad 130. In some embodiments, the seed layer 143 may be disposed on the surface 110s2 of the dielectric layer 110. In some embodiments, the seed layer 143 may be disposed under the portion 142. In some embodiments, the seed layer 143 may be in contact with the pad 130. In some embodiments, the seed layer 143 may be disposed on the sidewall of the dielectric layer 110. In some embodiments, the seed layer 143 may be disposed within the openings of the dielectric layer 110.

Figure 3:
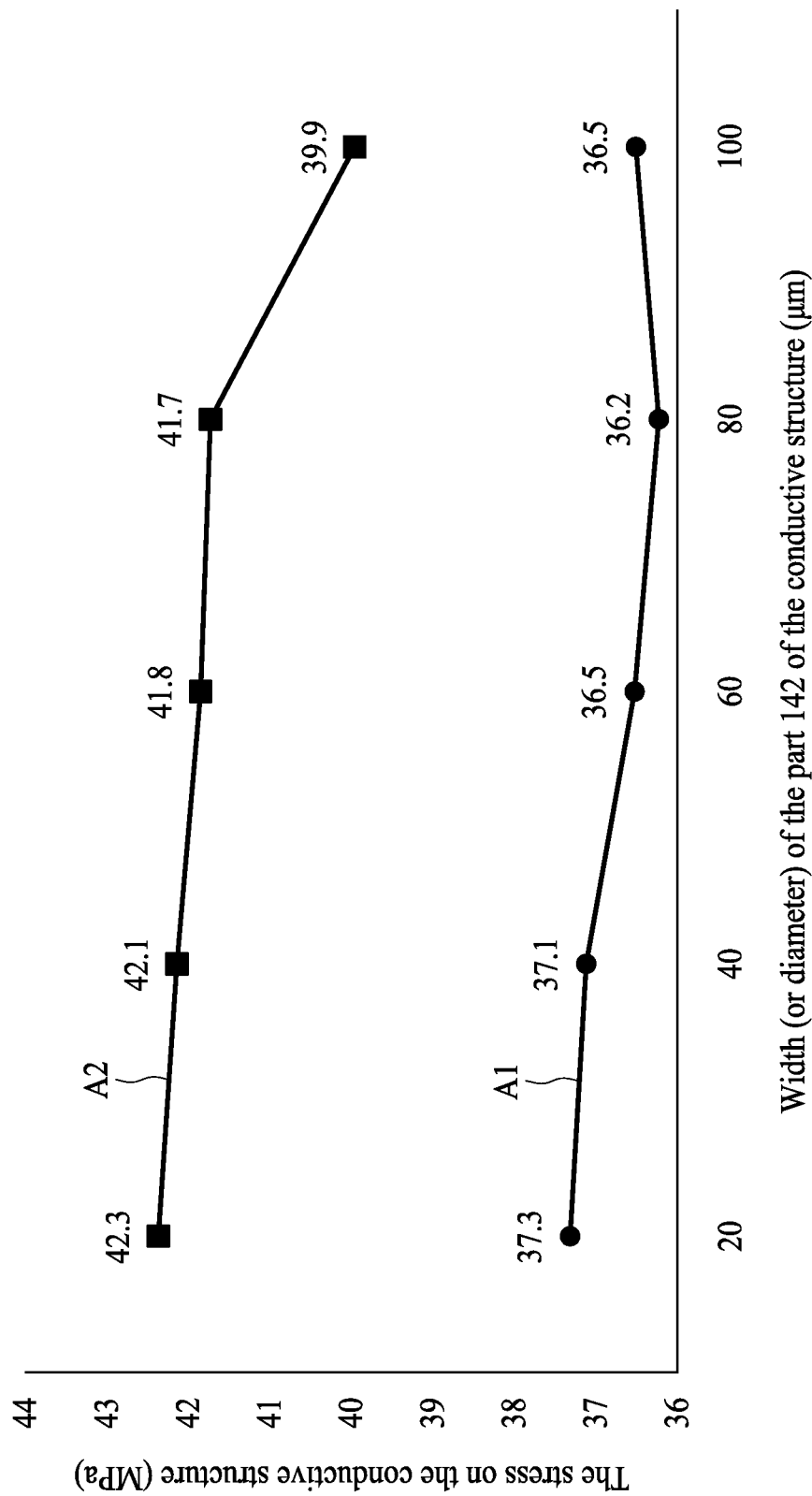
FIG. 3 illustrates simulation data of the relationship between stress on the conductive structure and the width of the main portion of the conductive structure.

FIG. 3 illustrates simulation data of the relationship between stress on the conductive structure 140 during patterned photoresist layer striping and the width (or diameter) of the portion 142. The line A1 is simulation data obtained from the semiconductor device structure 1a including the pad 130, while A2 is simulation data obtained from a comparative example that does not include a pad. Both lines A1 and A2 are obtained under a condition in which the portion 142 has a height of 110 µm and the dielectric layer 110 has a thickness of 7 µm. As shown in FIG. 3, as the width (or diameter) of the portion 142 increases, stress imposed on the conductive structure 140 decreases. Further, when the pad 130 is formed, stress imposed on the conductive structure 140 may further decrease.

Generally, when the conductive structure 140 suffers more stress, the conductive structure 140 may be prone to collapse under duress. As mentioned, after the conductive structure 140 is formed, the patterned photoresist layer will be striped, which imposes external strength on conductive structures 140. Based on collected data, when the portion 142 of the conductive structure 140 has a height of 110 µm, the conductive structure 140 may suffer stress of about 38 MPa. As shown in FIG. 3, the stress imposed on the conductive structure 140 may be reduced to less than 38 MPa if the semiconductor package structure 1a includes the pad 130. According to other simulation data, when a wafer has about $1.6*10^7$ conductive structures 140, the comparative example has 290 conductive structures which collapse after patterned photoresist layer striping, and more than 60% of the dies are impacted, while the semiconductor package structure 1a only has 2 conductive structures 140 collapse after patterned photoresist layer striping, and only 1.41% of the dies are impacted. It is supposed that the formation of the pad 130 may assist in enhancing bonding strength between the dielectric layer 110 and the conductive structure 140 to resist pull strength generated by patterned photoresist layer striping.

Figure 4:
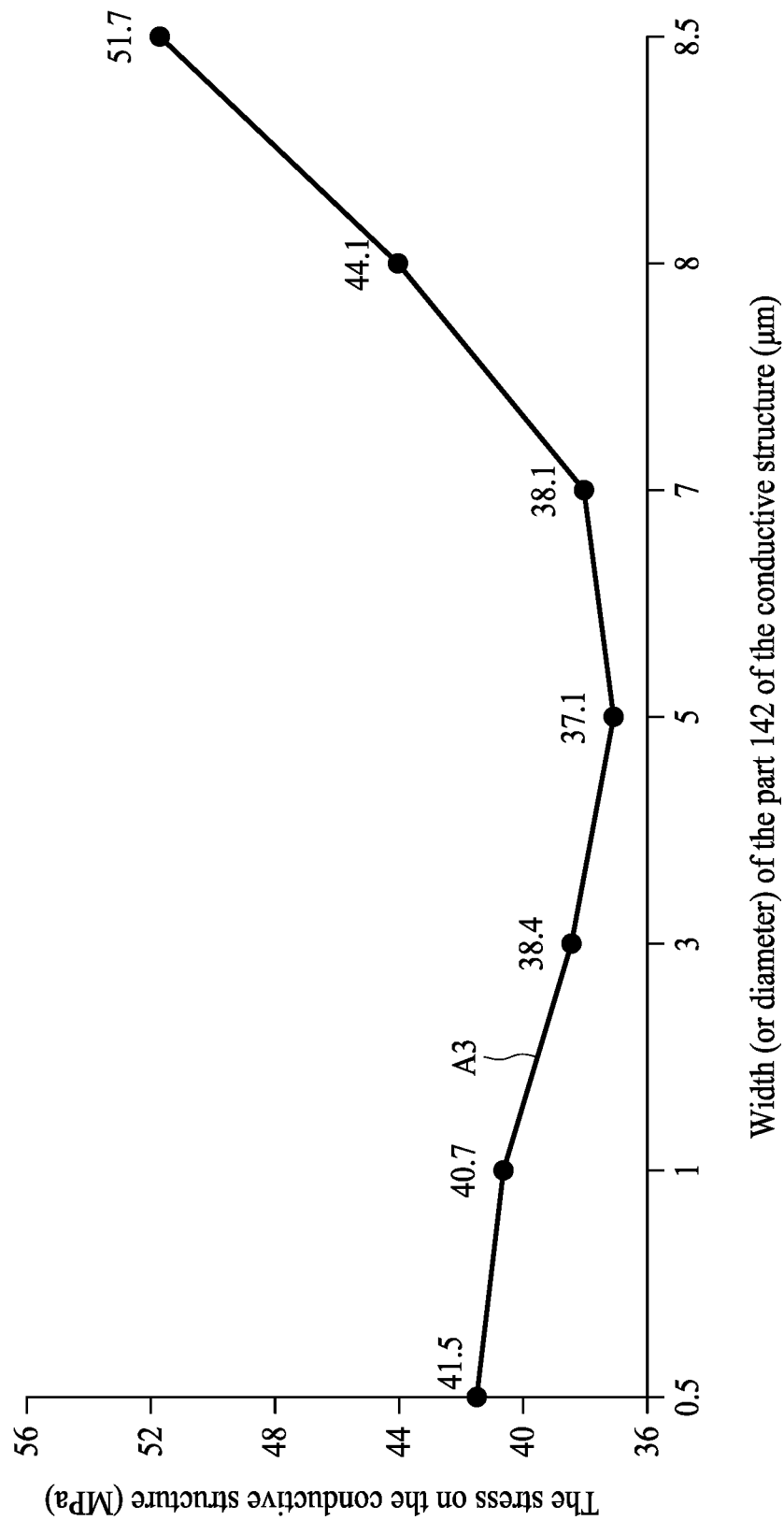
FIG. 4 illustrates simulation data of the relationship between stress on the conductive structure and the thickness of the pad.

FIG. 4 illustrates simulation data of the relationship between stress on the conductive structure 140 and the thickness of the pad 130. The line A3 is obtained under a condition in which portion 142 has a height of 110 µm and a width (or diameter) of 70 µm, and the dielectric layer 110 has a thickness of 9 µm.

As shown in FIG. 4, when the thickness of the pad 130 ranges from about 3 µm to about 7 µm, conductive structure 140 may experience less stress (e.g., of about 38 MPa). That is, when the pad 130 is in the aforementioned range, more conductive structures 140 may remain intact after the patterned photoresist layer is striped.

The pad 130 may assist in forming a conductive structure 140 with a greater aspect ratio (e.g., the portion 142 has an aspect ratio greater than 1.375, such as 1.4, 1.5, 1.6, 1.7 or 1.8) and may keep the conductive structure 140 intact.

Figure 5:
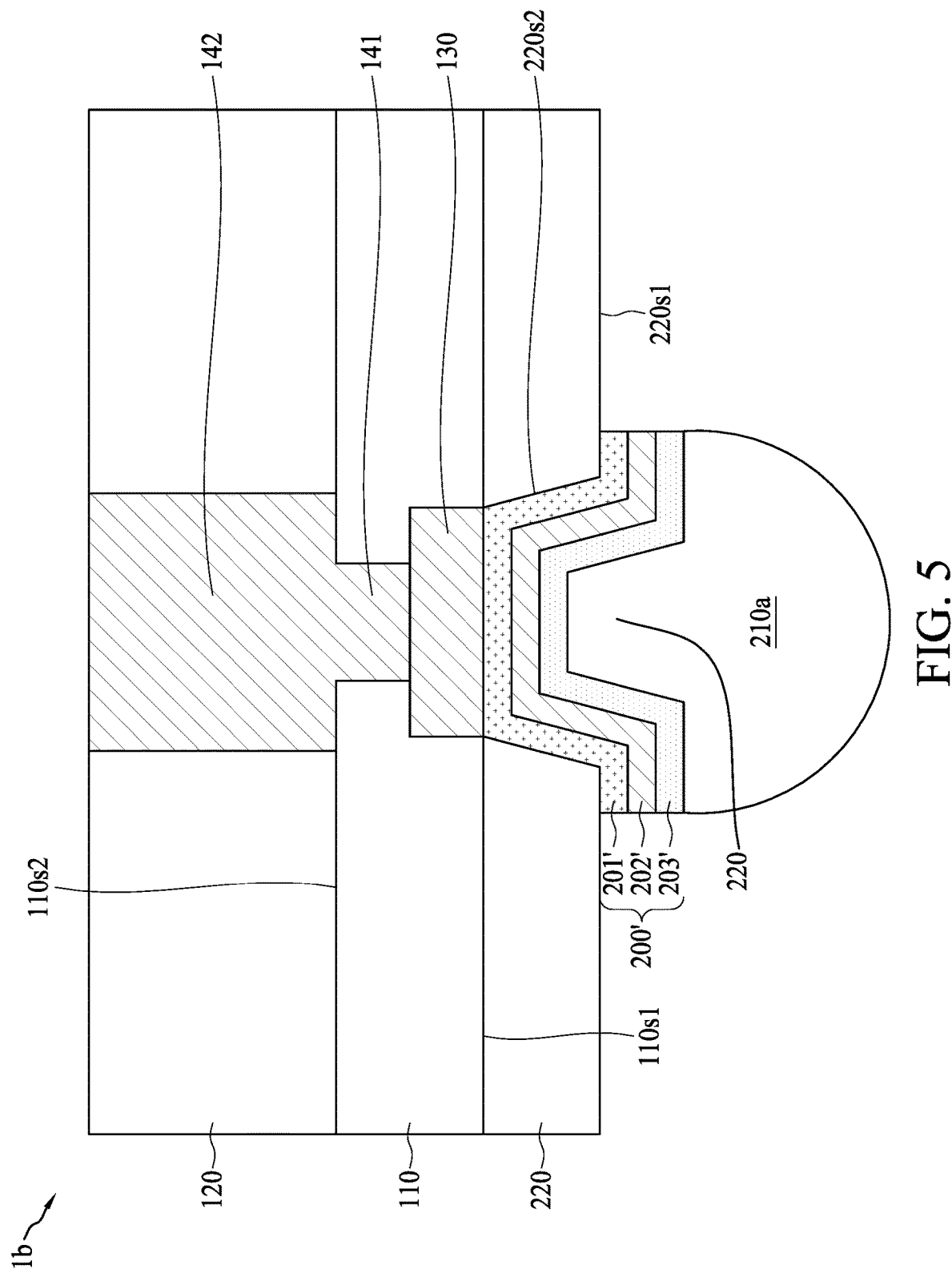
FIG. 5 is a cross-sectional view of an example of a semiconductor package structure according to some embodiments of the present disclosure.

FIG. 5 is a cross-sectional view of an example of a semiconductor package structure 1b according to some embodiments of the present disclosure. The semiconductor package structure 1b of FIG. 5 has a structure similar to that of the semiconductor package structure 1a of FIG. 2A other than the profile of the connection element 200'.

In some embodiments, the semiconductor package structure 1b may further include a dielectric layer 220. The dielectric layer 220 may be disposed on the surface 110s1 of the dielectric layer 110. The material of the dielectric layer 220 may be similar to or the same as that of the dielectric layer 110. The dielectric layer 220 may have a surface 220s1 facing away or spaced apart from the dielectric layer 110. The dielectric layer 220 may have a surface 220s2 (or a lateral surface) extending from the surface 110s1 of the dielectric layer 110 to the surface 220s1 of the dielectric layer 220. The dielectric layer 220 may have an opening 220o defined by the surface 220s2. The opening 220o may expose the pad 130. In some embodiments, the semiconductor package structure 1b may include a connection element 200'. The connection element 200' may include a layer 201', a layer 202' and a layer 203' corresponding to layer 201, the layer 202 and the layer 203 respectively. In some embodiments, a portion of the connection element 200' may be disposed within the opening 220o of the dielectric layer 220. For example, layer 201' may be disposed on and in contact with the pad 130 and extend to the surface 220s1 and the surface 220s2 of the dielectric layer 220. The layer 202' and the layer 203' may extend to the surface 220s1 through the surface 220s2 of the dielectric layer 220. The bump 210a may be disposed on the connection element 200'. In some embodiments, the bump 210a may fill in the opening 220o defined by the dielectric layer 220. Since there is a greater area of an interface between the connection element 200' and the bump 210a, the bonding strength between the bump 210a and the connection element 200' may be enhanced.

Figure 6:
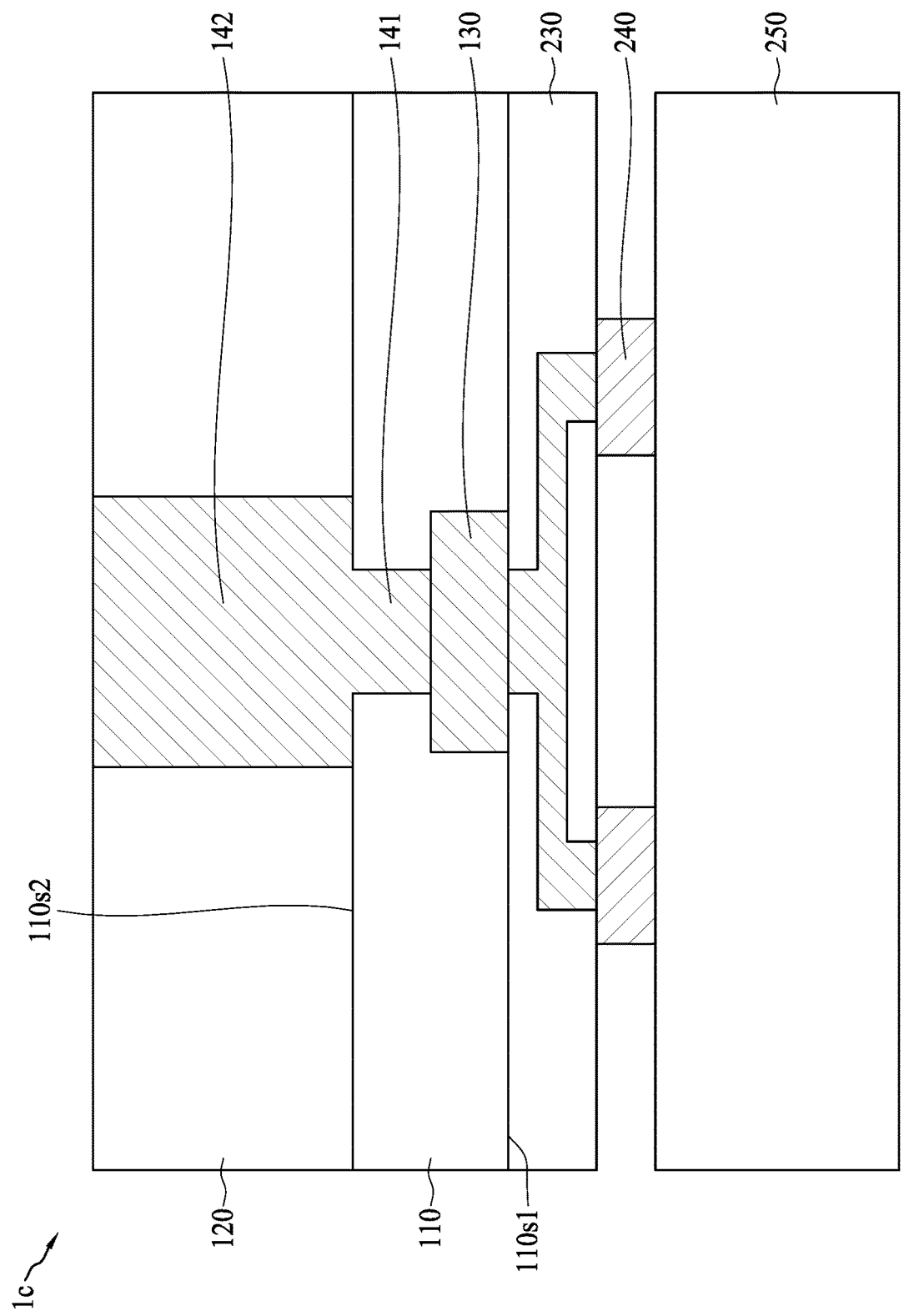
FIG. 6 is a cross-sectional view of an example of a semiconductor package structure according to some embodiments of the present disclosure.

FIG. 6 is a cross-sectional view of an example of a semiconductor package structure 1c according to some embodiments of the present disclosure. The semiconductor package structure 1c of FIG. 6 has a structure similar to that of the semiconductor package structure 1a of FIG. 2A except that the semiconductor package structure 1c may further include a semiconductor die 250.

In some embodiments, the semiconductor package structure 1c may further include a redistribution structure 230. The redistribution structure 230 may be disposed on the surface 110s1 of the dielectric layer 110. The redistribution structure 230 may include at least one dielectric layer, at least one circuit layer and at least one via embedded in the dielectric layer. In some embodiments, the redistribution structure 230 may be electrically connected to the redistribution structure 160 through the conductive structure 140. In some embodiments, the semiconductor die 250 may be disposed on the redistribution structure 230. The semiconductor die 250 may be adjacent to the surface 110s1 of the dielectric layer 110. The semiconductor die 250 may be electrically connected to the pad 130 through the redistribution structure 230 and conductive elements 240. The semiconductor die 250 may include an active device, a passive device, or other suitable devices. In this embodiment, the semiconductor die 172 and/or the semiconductor die 173 may be electrically connected to the semiconductor die 250 through the redistribution structure 230.

Figure 7:
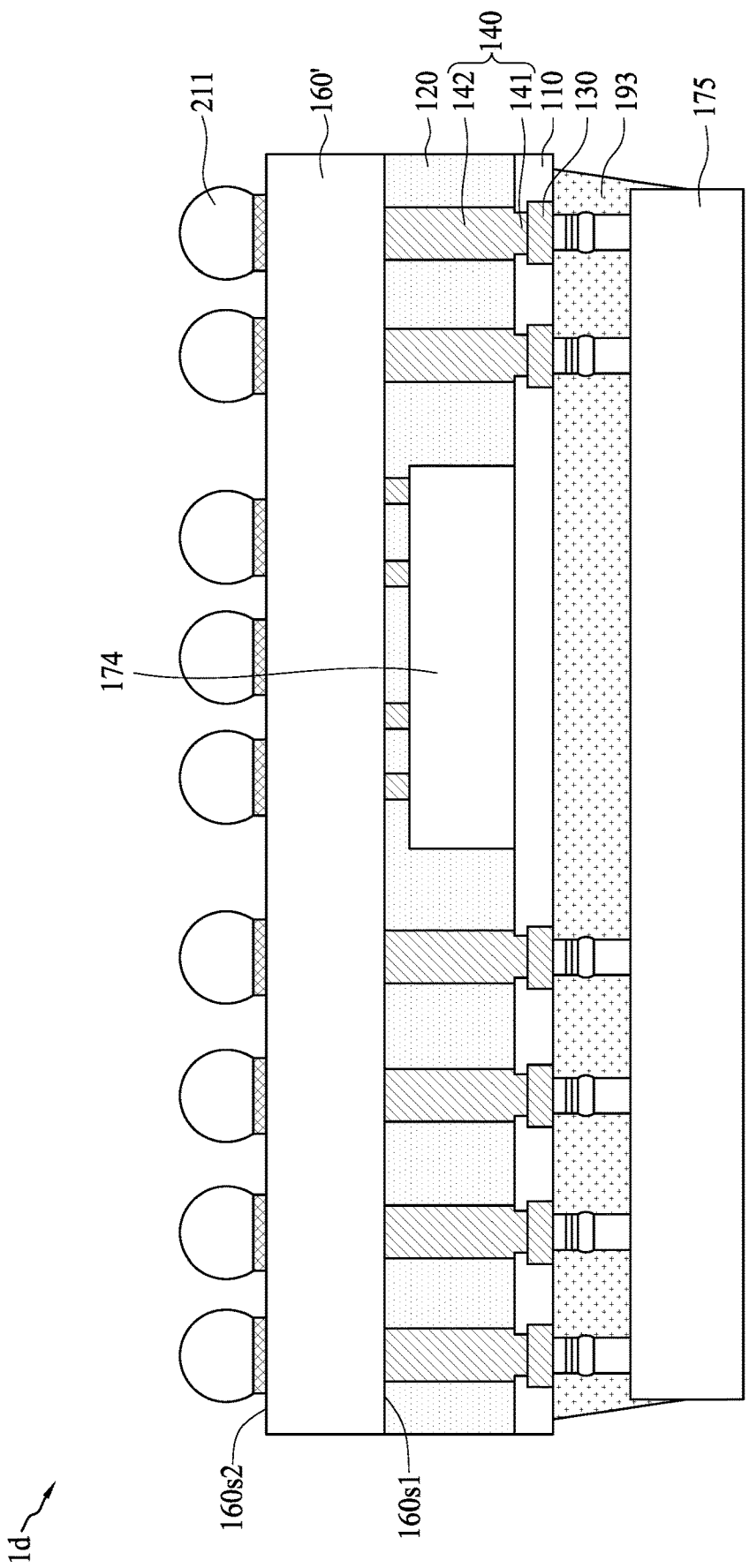
FIG. 7 is a cross-sectional view of an example of a semiconductor package structure according to some embodiments of the present disclosure.

FIG. 7 is a cross-sectional view of an example of a semiconductor package structure 1d according to some embodiments of the present disclosure. The semiconductor package structure 1d may include a FoPOP structure. The semiconductor package structure 1d may include a redistribution structure 160'. The redistribution structure 160' may be disposed on the encapsulant 120. The redistribution structure 160' may include multiple dielectric layers, circuit layers and vias embedded in the dielectric layers. The redistribution structure 160' may have a surface 160s1 facing the encapsulant and a surface 160s2 opposite to the surface 160s1. In some embodiments, bumps 211 may be disposed on the surface 160s2 of the redistribution structure 160'. In some embodiments, the semiconductor package structure 1d may include a semiconductor die 174 (or an electronic component) may be disposed on the surface 110s2 of the dielectric layer 110 and encapsulated by the encapsulant 120. The semiconductor die 174 may be an application processer chip. In some embodiments, the semiconductor package structure 1d may include a semiconductor die 175 (or an electronic component) may be disposed on the dielectric layer 110. The semiconductor die 175 and the semiconductor die 174 may be disposed on two opposite two sides of the dielectric layer 110 (e.g., the semiconductor die 174 may be disposed on the surface 110s2, and the semiconductor die 175 may be disposed on the surface 110s1). The semiconductor die 175 may be a HBM chip. The semiconductor package structure 1d may further include an underfill 193 covering a surface of the semiconductor die 175.

FIGS. 8A, 8B, 8C, 8D, 8E, 8F, 8G, 8H, 8I, 8J, 8K, 8L and 8M respectively illustrate one or more stages of an example of a method for manufacturing a semiconductor package structure according to some embodiments of the present disclosure, such as the semiconductor package structure 1a shown in FIG. 1.

Referring to FIG. 8A, a carrier 260 is provided. The carrier 260 may be used to assist in forming elements and/or layers thereon and will be removed in subsequent processes. A release layer 270 may be formed on the carrier 260. The release layer 270 may be used to assist in removing the carrier 260 in subsequent processes.

Referring to FIG. 8B, a seed layer 280 may be formed on the release layer 270. In some embodiments, the seed layer 280 may include, for example, titanium or other suitable materials.

Figure 8C:
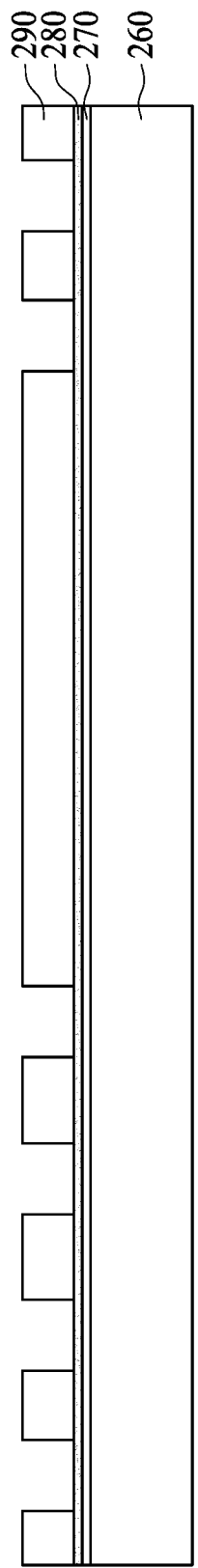

Referring to FIG. 8C, a patterned photoresist layer 290 may be formed on the seed layer 280. The patterned photoresist layer 290 may have a plurality of openings exposing the seed layer 280.

Figure 8D:
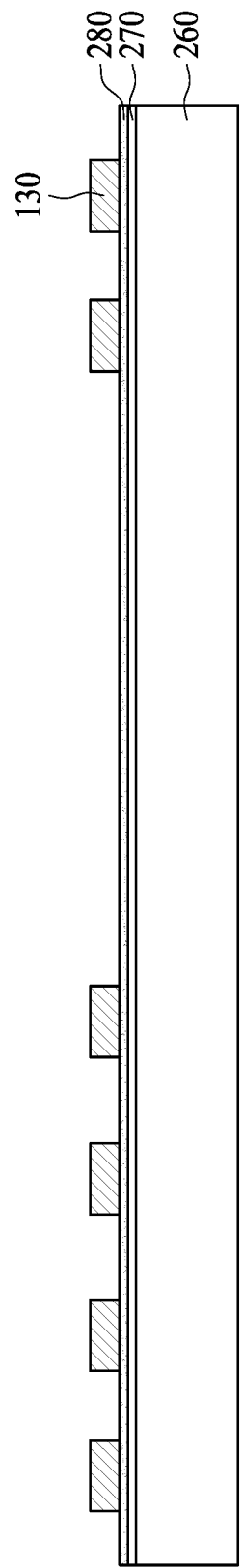

Referring to FIG. 8D, a plurality of pads 130 may be formed in the openings of the patterned photoresist layer 290 to cover the seed layer 280, and the patterned photoresist layer 290 may be removed. The pad 130 may be formed by, for example, an electroplating process or other suitable process.

Figure 8E:
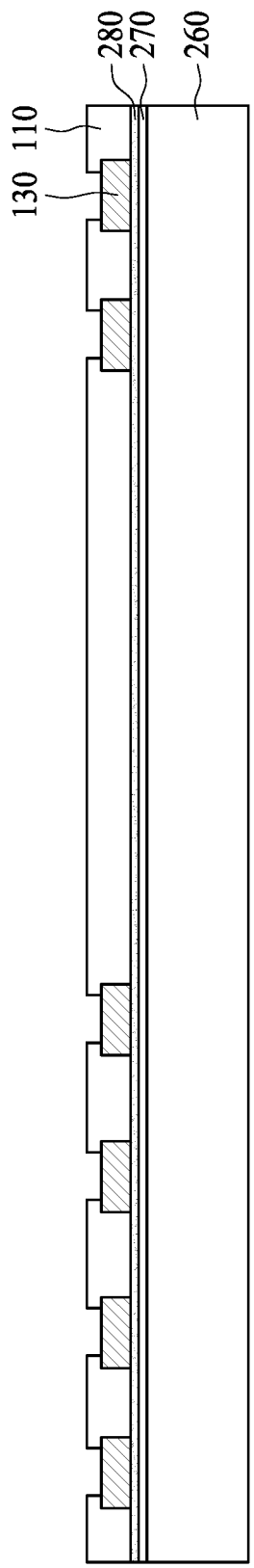

Referring to FIG. 8E, a dielectric layer 110 may be formed on the seed layer 280. In some embodiments, the dielectric layer 110 may cover a portion of the pad 130, and the other portion of the pad 130 may be exposed.

Figure 8F:
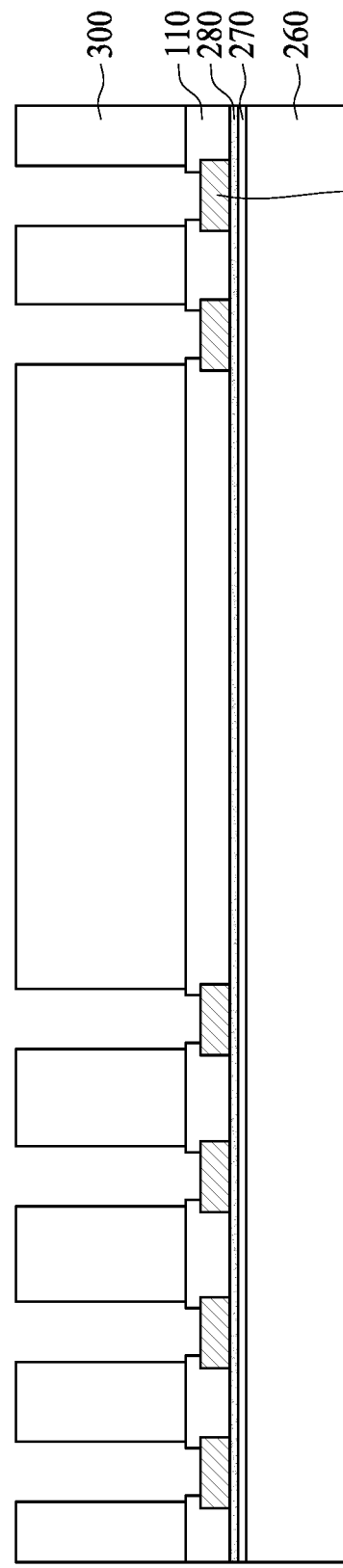

Referring to FIG. 8F, a patterned photoresist layer 300 may be formed on the dielectric layer 110. The patterned photoresist layer 300 may have a plurality of openings exposing a portion of the dielectric layer 110 and a portion of the pad 130. In some embodiments, a seed layer (not shown) may be formed prior to forming the patterned photoresist layer 300.

Figure 8G:
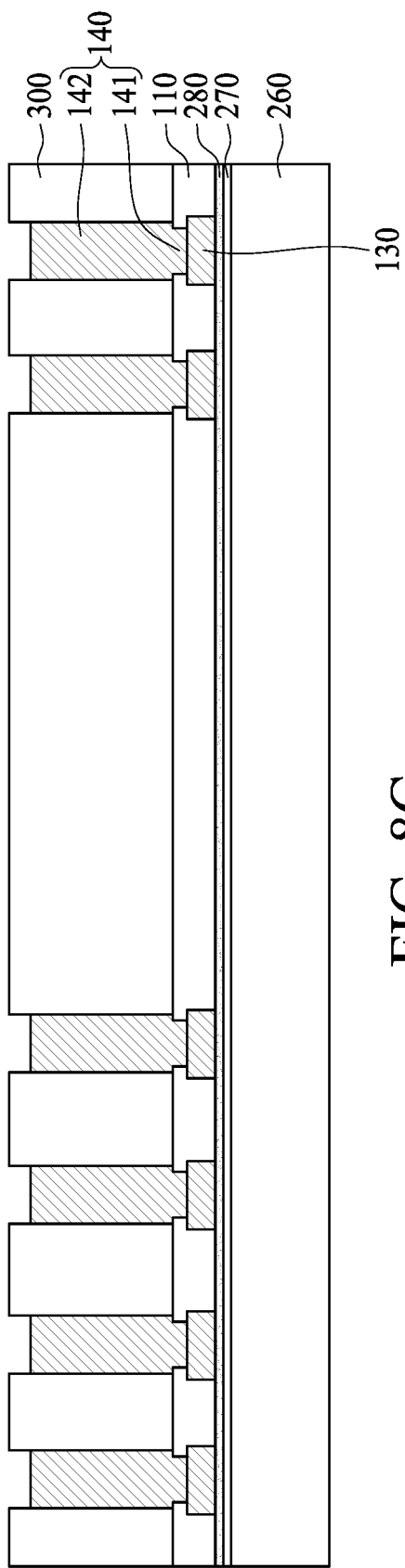

Referring to FIG. 8G, parts 141 and 142 may be formed in the openings of the patterned photoresist layer 300 and on the pad 130, thereby producing the conductive structure 140. The portion 141 and the portion 142 may be formed by an electroplating process or other suitable processes. As shown in FIG. 7G, the conductive structure 140 and the pad 130 may clip the dielectric layer 110. As a result, bonding strength between the conductive structure 140 and the dielectric layer 110 is enhanced.

Figure 8H:
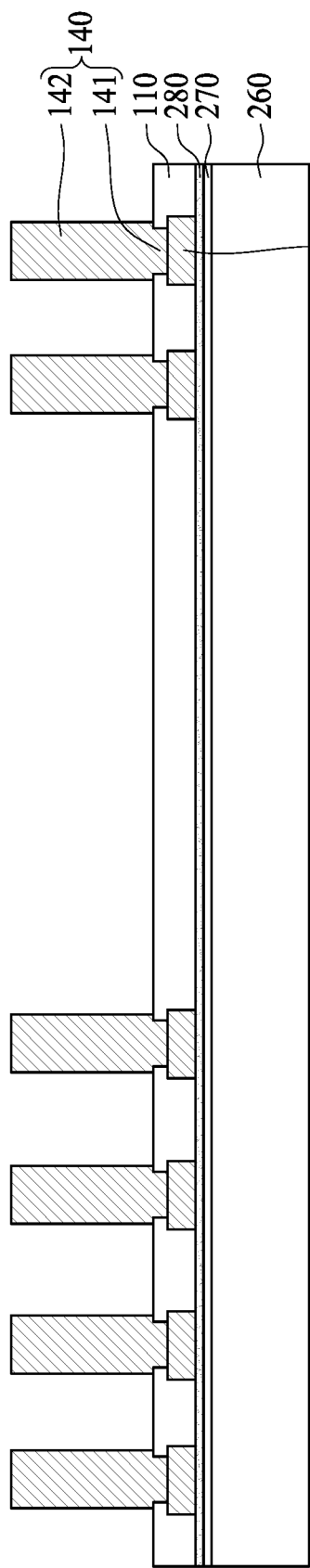

Referring to FIG. 8H, the patterned photoresist layer 300 may be striped, and the dielectric layer 110 may be exposed. The patterned photoresist layer 300 may be striped by etching. Since the patterned photoresist layer 300 is in contact with the portion 142 of the conductive structure 140, the portion 142 may suffer pulling strength generated by patterned photoresist layer striping 300, which may cause the portion 142 to collapse. In this embodiment, the clipped dielectric layer 110 enhances bonding strength between the conductive structure 140 and the dielectric layer 110, which can assist in the portion 142 resisting the pulling strength. Therefore, the conductive structure 140 may remain intact after the patterned photoresist layer 300 is striped.

Figure 8I:
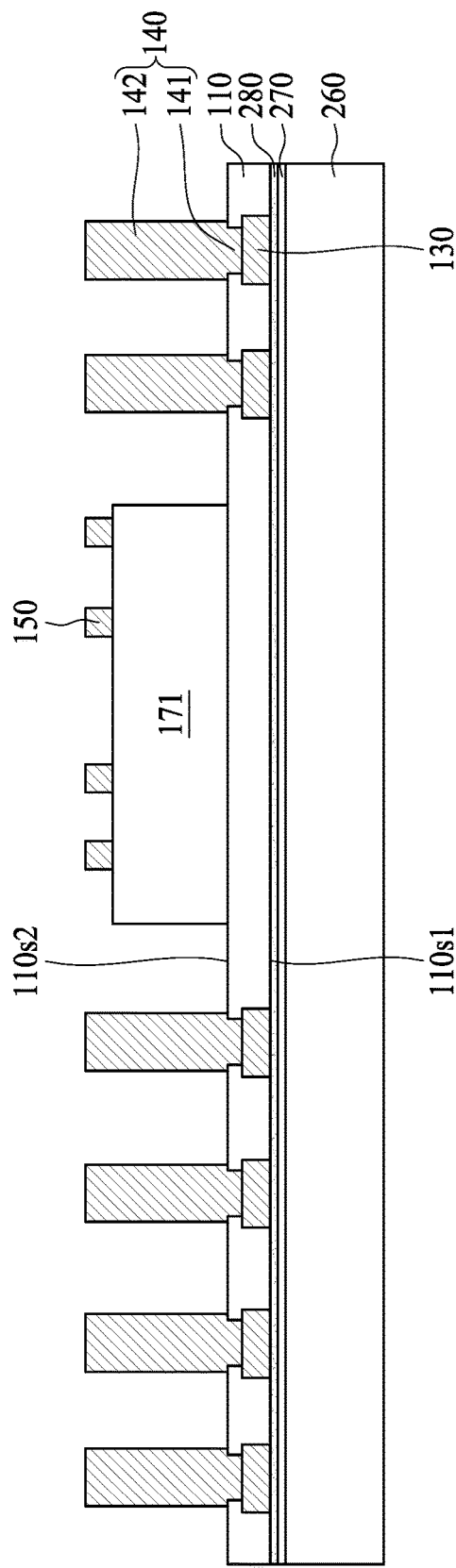

Referring to FIG. 8I, a bridge circuit 171 including a plurality of terminals 150 is formed on the dielectric layer 110. The bridge circuit 171 may be bonded on the surface 110s2 of the dielectric layer 110 by a die attach process. In some embodiments, the terminals 150 may be formed on the bridge circuit 171 before the bridge circuit 171 is bonded to the dielectric layer 110.

Figure 8J:
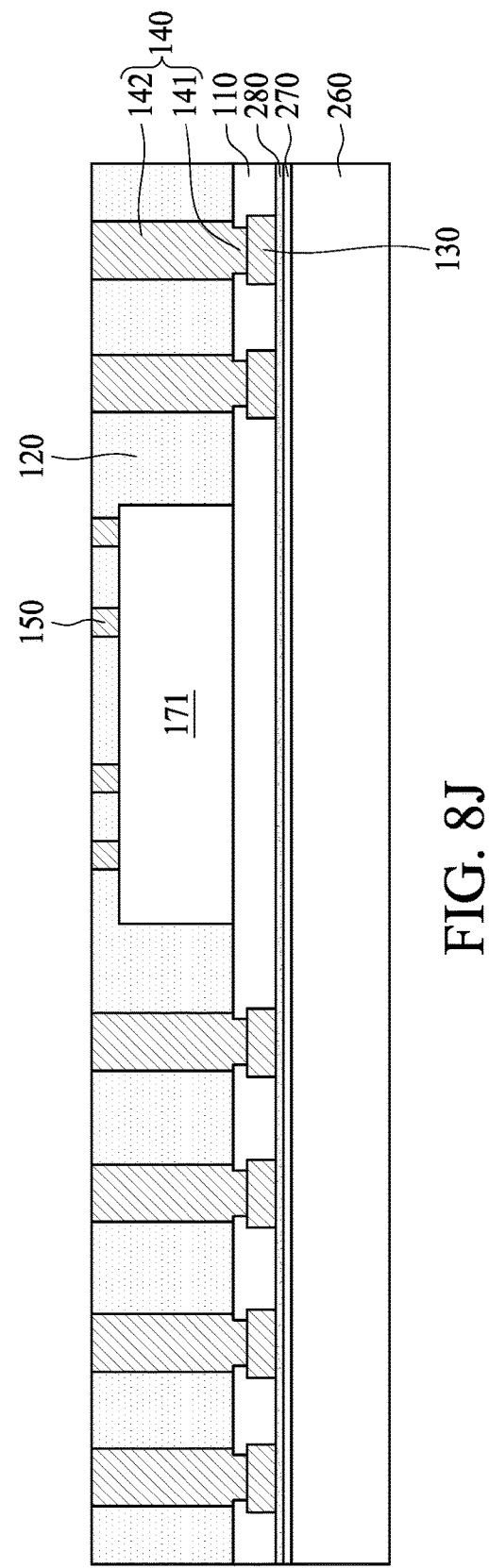

Referring to FIG. 8J, an encapsulant 120 is formed to cover the bridge circuit 171. A grinding process may be performed on the encapsulant 120 such that the top surfaces of the portion 142 and the top surfaces of the terminal 150 are exposed by the encapsulant 120. After the grinding process is performed, the top surface of the encapsulant 120, the top surface of the terminal 150 and the top surface of the portion 142 are substantially coplanar.

Figure 8K:
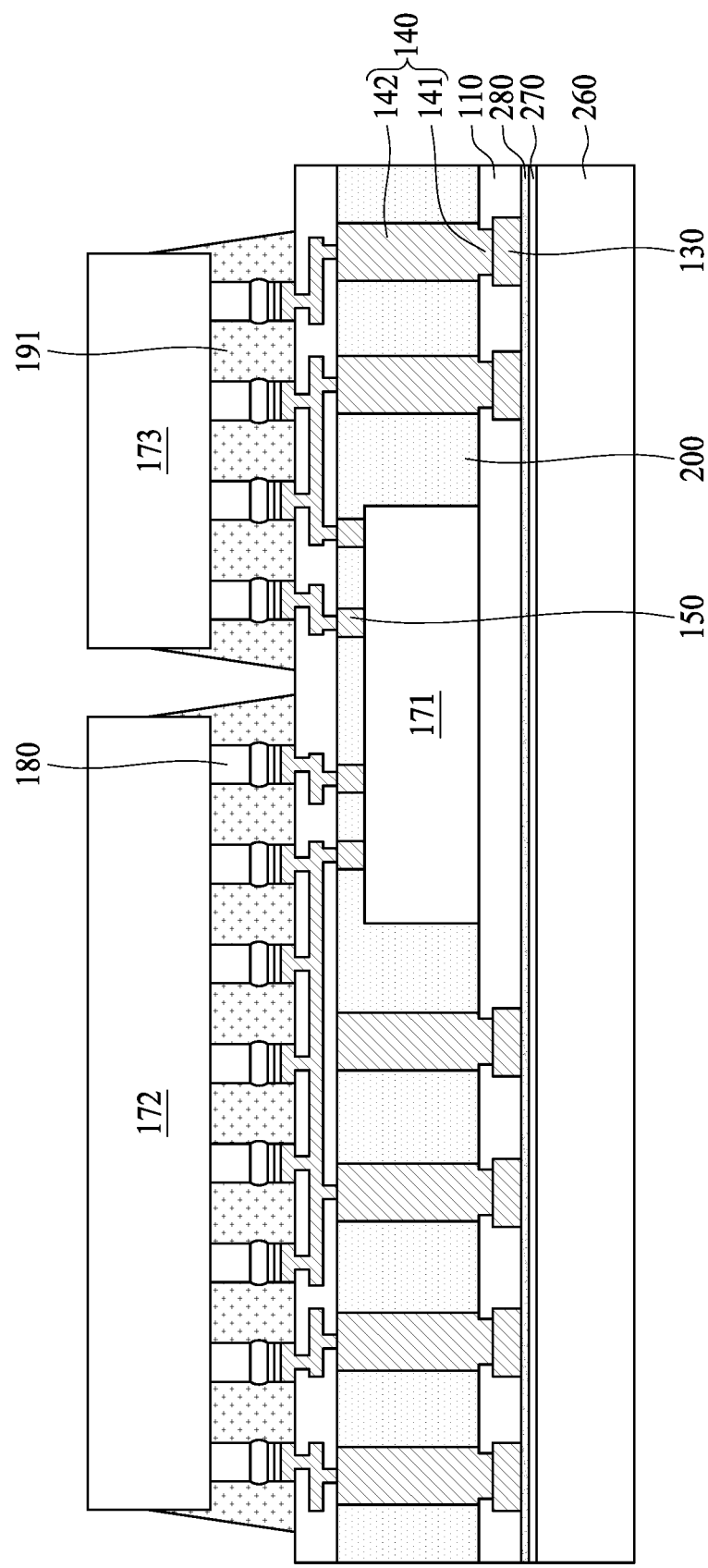

Referring to FIG. 8K, a redistribution structure 160 is formed on the encapsulant 120, and a semiconductor die 172 and a semiconductor die 173 may be formed on the redistribution structure 160. In some embodiments, the redistribution structure 160 may include two or more dielectric layers formed at different steps. In some embodiments, two or more circuit layers and/or via(s) may be formed at different steps. For example, a first dielectric layer may be formed on the encapsulant 120, and then the first dielectric layer is patterned to form a plurality of openings. Next, a first conductive material is deposited to fill the openings and cover the first dielectric layer, and then the first conductive material is patterned such that the first via and the first circuit layer is formed. These steps can be repeated to form the redistribution structure 160. The semiconductor die 172 and the semiconductor die 173 are bonded to and electrically connected to the redistribution structure 160. Each of the semiconductor die 172 and the semiconductor die 173 may include a plurality of connecting elements 180. The connecting elements 180 of the semiconductor die 172 and the semiconductor die 173 may be attached to the redistribution structure 160 such that the connecting elements 180 of the semiconductor die 172 and the semiconductor die 173 may be in contact with the redistribution structure 160. Moreover, an underfill 191, for example, made of epoxy, may be formed to cover and protect the connecting elements 180 of the semiconductor die 172 and the semiconductor die 173.

Figure 8L:
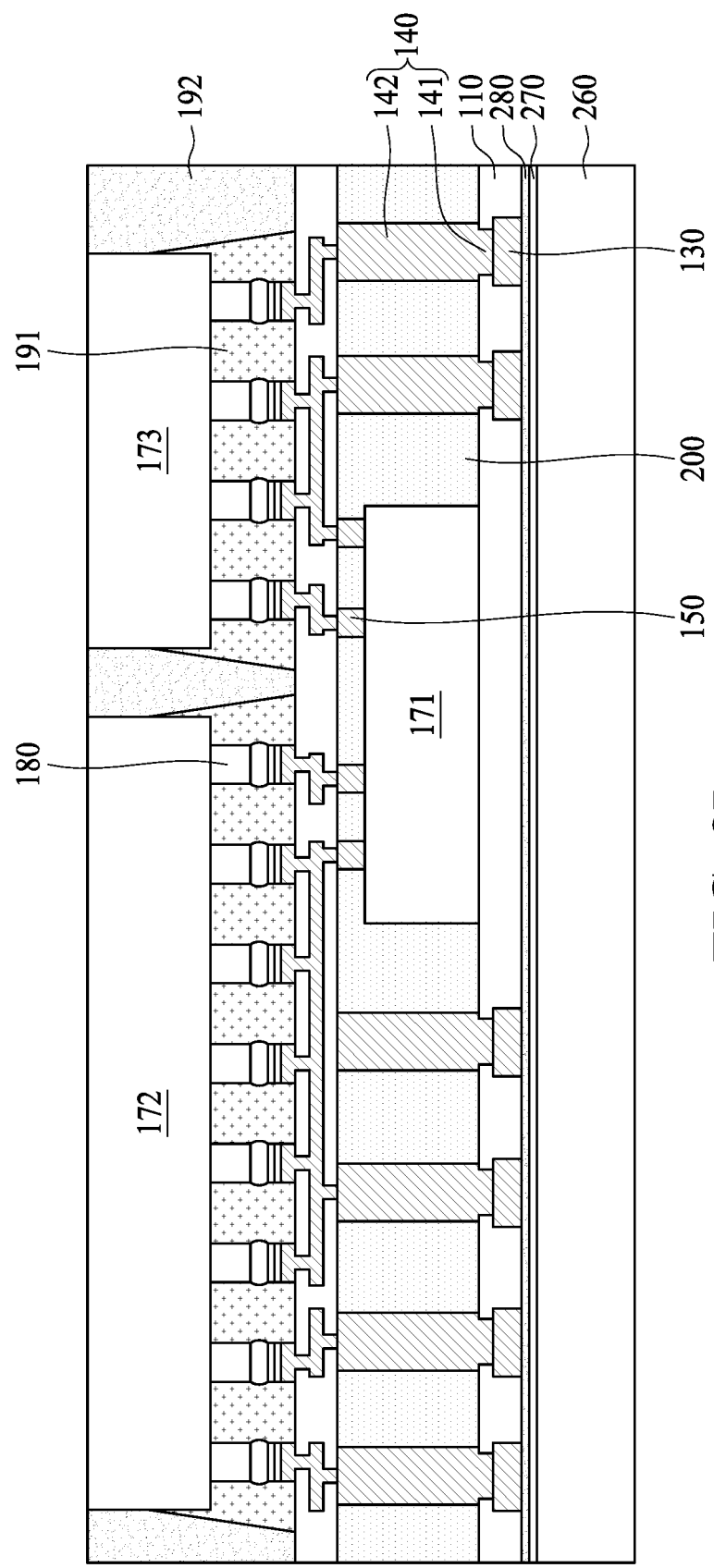

Referring to FIG. 8L, an encapsulant 192 may be formed on the underfill 191 and surround the semiconductor die 172 and the semiconductor die 173.

Figure 8M:
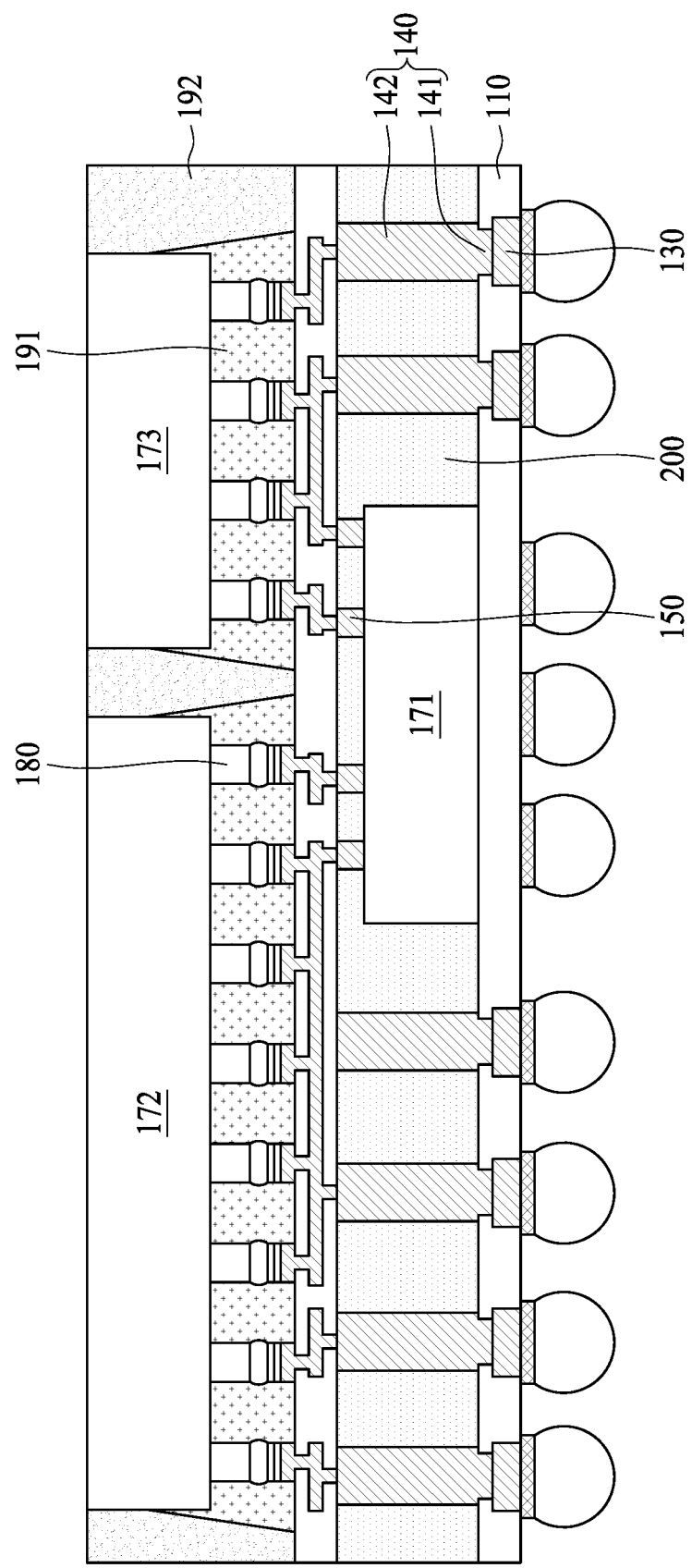

Referring to FIG. 8M, the carrier 260, the release layer 270 and the seed layer 280 are removed, and a plurality of connection elements 200 and a plurality of bumps 210a and bumps 210b are formed to produce the semiconductor package structure 1a. The connection element 200 may be formed on the surface 110s1 of the dielectric layer 110. The bump 210a and bump 210b may be formed on the connection element 200. In some embodiments, the bump 210a and bump 210b are formed by a ball drop process.

As mentioned, the clipped dielectric layer 110 enhances bonding strength between the dielectric layer 110 and the conductive structure 140, thereby preventing collapse of the conductive structure 140. For example, if the portion 142 has a height of 110 μm and a width (or diameter) of 70 μm and the dielectric layer 110 a thickness of 7 the yield may be enhanced by up to 98%.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
   a first dielectric layer having a first surface and a second surface opposite to the first surface;
   a pad adjacent to the first surface and at least partially embedded in the first dielectric layer, wherein the first dielectric layer has an opening exposing the pad, and a width of the opening is less than a width of the pad; and
   a conductive structure disposed on the pad and composed of a first portion outside the opening of the first dielectric layer and a second portion embedded in the opening of the first dielectric layer, wherein the first portion has an aspect ratio exceeding 1.375,
   wherein a width of the first portion is greater than a width of the second portion.

2. The substrate structure of claim 1, wherein the first portion of the conductive structure has a height greater than 110 μm.

3. The substrate structure of claim 1, wherein the first portion of the conductive structure has a width less than about 70 μm.

4. A substrate structure, comprising:

a first dielectric layer having a first surface and a second surface opposite to the first surface;

a pad adjacent to the first surface and at least partially embedded in the first dielectric layer, wherein the first dielectric layer has an opening exposing the pad, and a width of the opening is less than a width of the pad;

a conductive structure disposed on the pad and composed of a first portion outside the opening of the first dielectric layer and a second portion embedded in the opening of the first dielectric layer, wherein the first portion has an aspect ratio exceeding 1.375; and a seed layer as an outermost part of the second portion of the conductive structure.

5. A substrate structure, comprising:

a first dielectric layer having a first surface and a second surface opposite to the first surface;

a pad adjacent to the first surface and at least partially embedded in the first dielectric layer, wherein the first dielectric layer has an opening exposing the pad, and a width of the opening is less than a width of the pad; and a conductive structure disposed on the pad and composed of a first portion outside the opening of the first dielectric layer and a second portion embedded in the opening of the first dielectric layer, wherein the first portion has an aspect ratio exceeding 1.375; and a seed layer on the second surface of the first dielectric layer.

6. A substrate structure, comprising:

a first dielectric layer having a first surface and a second surface opposite to the first surface;

a pad adjacent to the first surface and at least partially embedded in the first dielectric layer, wherein the first dielectric layer has an opening exposing the pad, and a width of the opening is less than a width of the pad;

a conductive structure disposed on the pad and composed of a first portion outside the opening of the first dielectric layer and a second portion embedded in the opening of the first dielectric layer, wherein the first portion has an aspect ratio exceeding 1.375; and an encapsulant disposed on the second surface of the first dielectric layer, wherein the encapsulant encapsulates the conductive structure.

7. The substrate structure of claim 6, further comprising: an electronic component encapsulated by the encapsulant.

8. The substrate structure of claim 1, wherein the width of the pad is greater than the width of the first portion of the conductive structure.

9. The substrate structure of claim 1, wherein a ratio between a thickness of the pad and a thickness of the first dielectric layer ranges from 0.42 to 0.78.

10. The substrate structure of claim 1, wherein the thickness of the pad is greater than 3 μm.

11. The substrate structure of claim 10, wherein the thickness of the pad ranges from 3 μm to 7 μm.

12. A semiconductor package structure, comprising:

a first dielectric layer having a first surface and a second surface opposite to the first surface;

a pad adjacent to the first surface and at least partially embedded in the first dielectric layer, wherein the first dielectric layer has an opening exposing the pad, and a width of the opening is less than a width of the pad; and a conductive structure disposed on the pad and partially in the opening of the first dielectric layer;

a first redistribution structure disposed on the conductive structure; and an electronic component disposed on the second surface of the first dielectric layer, wherein the conductive structure is composed of a first portion outside the opening of the first dielectric layer and a second portion embedded in the opening of the first dielectric layer, and a width of the first portion is greater than a width of the second portion, and wherein the first portion of the conductive structure has an aspect ratio exceeding about 1.375.

13. The semiconductor package structure of claim 12, wherein a ratio between a thickness of the pad and a thickness of the first dielectric layer ranges from 0.42 to 0.78.

14. The semiconductor package structure of claim 12, wherein a thickness of the pad is greater than 3 μm.

15. The substrate structure of claim 1, wherein the first dielectric layer covers a sidewall of the pad.

16. The substrate structure of claim 1, wherein the pad has a first surface concaved from the first surface of the first dielectric layer.

17. The semiconductor package structure of claim 12, further comprising:

a semiconductor die disposed on the first redistribution structure and electrically connected to the pad through the conductive structure.

* * * * *